(12) United States Patent
Sanchez

(10) Patent No.: US 9,716,505 B2
(45) Date of Patent: Jul. 25, 2017

(54) SYSTEM AND METHOD FOR ENHANCED CLOCKING OPERATION

(71) Applicant: Hector Sanchez, Cedar Park, TX (US)

(72) Inventor: Hector Sanchez, Cedar Park, TX (US)

(73) Assignee: NXP USA, Inc., Austin, TX (US)

(*) Notice: Subject to any disclaimer, the term of this patent is extended or adjusted under 35 U.S.C. 154(b) by 175 days.

(21) Appl. No.: 14/570,946

(22) Filed: Dec. 15, 2014

(65) Prior Publication Data

US 2016/0173067 A1  Jun. 16, 2016

(51) Int. Cl.
| H03K 5/156 | (2006.01) |
| G06F 1/10 | (2006.01) |
| H03L 7/08 | (2006.01) |
| H03K 5/00 | (2006.01) |
| H03L 7/00 | (2006.01) |

(52) U.S. Cl.
CPC ............... *H03L 7/08* (2013.01); *G06F 1/10* (2013.01); *H03K 5/00006* (2013.01); *H03K 5/1565* (2013.01); *H03L 7/00* (2013.01)

(58) Field of Classification Search
CPC ........ H03K 5/00006; H03K 5/04; H03K 5/06; H03K 5/15; H03K 5/1565; H03L 7/06; H03L 7/08; G06F 1/04–1/10
See application file for complete search history.

(56) References Cited

U.S. PATENT DOCUMENTS

| 6,624,681 | B1 | 9/2003 | Loyer et al. | |
| 7,095,251 | B2 | 8/2006 | Wilcox et al. | |
| 7,317,342 | B2 | 1/2008 | Saint-Laurent | |
| 7,463,075 | B2 * | 12/2008 | White | H03K 5/1565 |
| | | | | 327/172 |
| 7,808,293 | B2 | 10/2010 | Fujisawa | |
| 8,558,594 | B2 * | 10/2013 | Tang | G06F 1/10 |
| | | | | 327/218 |
| 8,604,831 | B2 * | 12/2013 | Myers | G06F 1/10 |
| | | | | 326/93 |
| 9,319,037 | B2 * | 4/2016 | Iyer | H03K 5/131 |
| 2002/0060594 | A1 * | 5/2002 | Stasiak | G06F 1/10 |
| | | | | 327/295 |
| 2003/0201806 | A1 * | 10/2003 | Cho | G06F 7/68 |
| | | | | 327/116 |

OTHER PUBLICATIONS

Hsueh et al., A 0.29mm2 Frequency Synthesizer in 40 nm CMOS with 0.19psrms Jitter and <-100dBc Reference Spur for 802.11ac, IEEE International Solid-State Circuits Conference 2014, Session 28, Mixed-Signal Techniques for Wireless 28.2, p. 472-474, 3 pages.

* cited by examiner

*Primary Examiner* — Patrick O'Neill

(57) ABSTRACT

A circuit, integrated circuit, system tor implementation in an integrated circuit, and method of operating such a circuit, integrated circuit, or system are disclosed herein. In one example embodiment, the such a circuit includes a multiplier circuit portion, a first duty cycle correction (DCC) circuit portion, and a clock gating circuit portion. The multiplier circuit portion, DCC circuit portion, and clock gating circuit portion are all coupled in series with one another between an input port and an output port of the circuit. Additionally, the circuit is capable of receiving at the input port a first clock signal having a first frequency and, based at least indirectly upon the first clock signal, outputting a second clock signal having a second frequency that is related by a factor to the first frequency.

19 Claims, 3 Drawing Sheets

SYSTEM AND METHOD FOR ENHANCED CLOCKING OPERATION

CROSS-REFERENCE TO RELATED APPLICATIONS

STATEMENT REGARDING FEDERALLY SPONSORED RESEARCH OR DEVELOPMENT

FIELD OF THE DISCLOSURE

The present disclosure relates to electrical systems and circuits such as integrated circuits and, more particularly, to such systems and circuits that employ clock signals that can serve any of a variety of purposes.

BACKGROUND OF THE DISCLOSURE

Integrated circuits commonly employ clock signals for a variety of purposes including, for example, to coordinate the timing of various actions taken by or operations performed by the integrated circuits. Not withstanding the ubiquity of clock signals in integrated circuits, there are several limitations that can occur in various integrated circuits associated with the use of such clock signals.

First, many integrated circuits employ phase-locked loops (PLLs) and it is often desired that the reference clock signals be as low as possible to reduce bill of materials (BOM) costs at the circuit board level, yet providing low reference clock signals can increase PLL jitter. Also, even though there is typically a desire to minimize power dissipation by integrated circuits, the distribution of clock signals can nevertheless entail a relatively high amount of power dissipation. Additionally, clock gating at high speeds can result in unnecessary power increases due to tight setup times of high frequency clocks. Further, conventional arrangements can suffer from excessive gain occurring at voltage controlled oscillators (VCOs), and PLL VCO bandwidth reduction is often desirable to address these issues, yet conventional clock arrangements can be inconsistent with these goals.

For at least these reasons, therefore, it would be advantageous if new or improved systems and methods for enhanced clocking operation could be achieved in integrated circuits or other electrical systems or circuits that addressed one or more of the above-discussed limitations or other limitations.

DETAILED DESCRIPTION

Embodiments of systems, circuits, and methods described herein are configured to generate higher-speed clock signals by way of circuitry that is simpler, smaller, or otherwise more desirable than conventional clocking circuitry that might be utilized to generate such higher-speed clock signals. In at least some such systems, circuits, and methods that are described herein, duty-cycle corrected multiply-by-two (×2) circuitry is particularly employed. Also, at least some such embodiments include not only strategic placement of duty cycle correction (DCC) circuits or circuit blocks in conjunction or combination with ×2 circuits or circuit blocks, but also additionally include clock gating cell (CGC) circuits or circuit blocks (which also can be referred to as clock gating cells). The implementation of such circuitry particularly can be simpler and/or smaller by comparison with conventional clocking circuitry such as, for example, multiple phase-locked loop (PLL) circuits that are used to multiply signals for a reference PLL circuit (that is, the ×2 circuitry is non-PLL frequency multiply-by-two circuitry). In addition to being simpler or smaller relative to conventional circuit implementations, such circuitry employing both DCC and ×2 circuits (and possibly CGC circuits as well) can also reduce the need for specialized power supplies and other circuitry that PLL circuits typically demand. Further, the use of ×2 circuits coupled with DCC circuits and possibly also CGC circuits not only can allow for reductions in global clock distribution power but also can allow for the lowering of the voltage controlled oscillator (VCO) Fmax that is required (maximum frequency required). This can lead to lower VCO gain and can be beneficial in terms of reducing the amount of jitter or avoiding increases in jitter.

Figure 1:
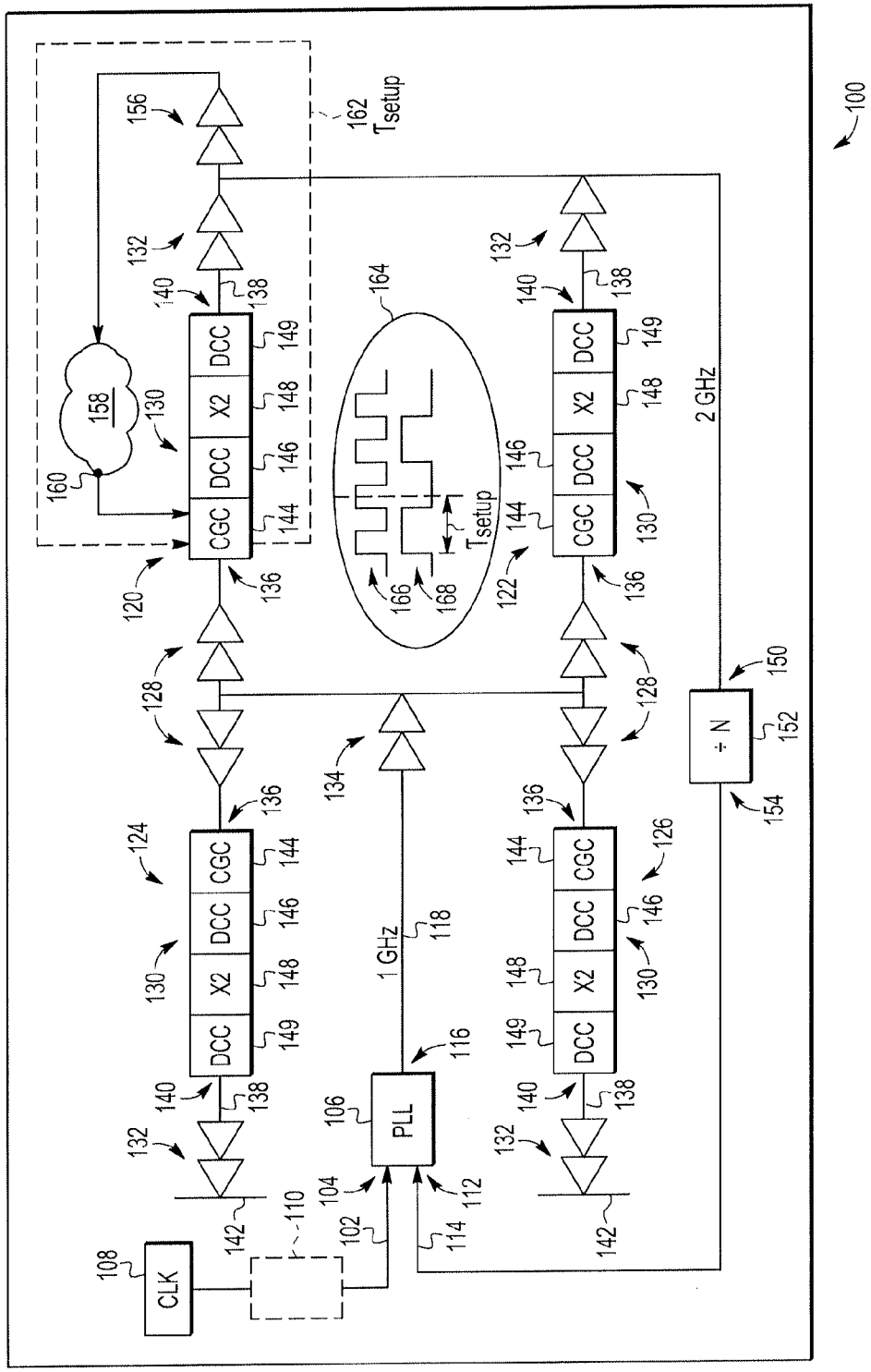
FIG. 1 is a schematic diagram showing an example integrated circuit that includes example circuitry for distributing clock signals in accordance with one example embodiment of the present disclosure.

Referring to FIG. 1, an example integrated circuit 100 is illustrated in schematic form, and in particular example components (which can also herein be referred to as circuits, or circuit portions) used to provide clocking signals and to distribute clocking signals to various portions of the integrated circuit are shown. As illustrated, a reference clock signal 102 is provided as an input to a first input port 104 of a phase-locked loop (PLL) circuit 106. The clock signal 102 is provided from a clock (or clock circuit) 108 that can be directly coupled to the input port 104 or indirectly coupled to the input port, for example, by way of an optional intermediate circuit represented by a dashed box 110. In addition to receiving the reference clock signal 102 at the first input port 104, the PLL circuit 106 also receives, at a second input port 112, a second input signal 114, which is discussed in more detail below. Based upon the reference clock signal 102 and the additional input signal 114 respectively received at the first and second input ports 104 and 112 of the PLL circuit 106, respectively, the PLL circuit operates to output, at an output port 116, an additional clock signal 118 that is to be distributed to various other components of the integrated circuit 100.

In the present embodiment, the integrated circuit 100 particularly includes first, second, third, and fourth circuit portions 120, 122, 124, and 126, respectively, to which the additional clock signal 118 can potentially be distributed, although in alternate embodiments any number of such circuit portions can be present in a given integrated circuit (e.g., one or any number more than one such circuit portions can be present, although for the clock signal to be distributed, typically there are more than one such circuit portion present). Further in the present embodiment, the integrated circuit 100 and the circuit portions 120, 122, 124, and 126 thereof include various circuit subportions. In particular, each of the first, second, third, and fourth circuit portions 120, 122, 124, and 126 in the present embodiment includes a respective first buffer circuit portion 128, a respective intermediate circuit portion 130, and a respective second buffer circuit portion 132.

Each of the respective first buffer circuit portions 128 is coupled to the output port 116 of the PLL circuit 106 by way of an additional buffer circuit portion 134. Further, each of the first buffer circuit portions 128, second buffer circuit portions 132, and additional buffer circuit portion 134 in the present embodiment is represented as a pair of series-coupled buffers (each of which can be a circuit or circuit portion such as, for example, an operational amplifier) and can also be referred to as clock tree portions. Although each of the buffer circuit portions 128, 132, and 134 is shown as a pair of series-coupled buffers, in other embodiments each such buffer circuit portion can comprise any number of buffers ranging from merely a single buffer to more than two buffers. With respect to each of the buffer circuit portions 128, 132, and 134, the respective buffer circuit portion operates to receive a signal at an input terminal of a first of the buffers of the respective buffer circuit portion, the output terminal of that buffer in turn communicates a signal to the input terminal of a second of the buffers of the respective buffer circuit portion, and the output of that second buffer in turn is provided as the output of the respective buffer circuit portion, from the respective output terminal of each respective buffer circuit portion.

In view of the above discussion and FIG. 1, it should therefore be appreciated that the flow of clock signals by way of the PLL circuit 106, additional buffer circuit portion 134, first buffer circuit portions 128, intermediate circuit portions 130, and second buffer circuit portions 132 proceeds as follows. First, the PLL circuit 106 outputs the additional clock signal 118 based at least indirectly upon the reference clock signal 102 and additional input signal 114, and that additional clock signal 118 is provided to the input terminal of the additional buffer circuit portion 134. Subsequently, the additional clock signal 118 (or a clock signal based thereupon) is output by the output terminal of the additional buffer circuit portion 134 and is provided to each of the input terminals of each of the first buffer circuit portions 128 of the first, second, third, and fourth circuit portions 120, 122, 124, and 126. Then, the additional clock signal 118 (or a clock signal based thereon) is provided from the respective output terminal of each respective one of the first buffer circuit portions 128 and received by a respective input terminal 136 of each respective one of the intermediate circuit portions 130. Subsequently, a respective modified clock signal 138 is output from a respective output terminal 140 of each respective one of the intermediate circuit portions 130 for receipt by the respective input terminal of the respective one of the second buffer circuit portions 132 that is coupled to the respective output terminal 140.

As will be described in further detail below, the modified clock signals 138 in the present embodiment are not identical to the additional clock signal 118 output by the PLL circuit 106, but rather are generated by the intermediate circuit portions 130 based upon the additional clock signal 118, and have a different frequency than the additional clock signal 118. Upon the modified clock signals 138 being transmitted from each respective intermediate circuit portion 130 to the respective one of the second buffer circuit portions 132, the modified clock signals 140 received by the second buffer circuit portions 132 (or further modified clock signals based at least indirectly upon, and having the same frequency as, the modified clock signals 140) are further output by the respective output terminals of the respective second buffer circuit portions and provided to one or more respective circuit components that utilize clocking signals. Although such ultimate recipients of the modified clock signals are not shown in particular detail in FIG. 1, it can be appreciated that any one or more of any variety of circuit components (or circuits or circuit portions) can receive the modified clock signals 140, and it is intended for example that first and second lines 142 are representative of such circuit components that receive the modified clock signals 140 as those modified clock signals are output by the second buffer circuit portions 132.

Further as shown in FIG. 1, in the present embodiment, each of the intermediate circuit portions 130 of the first, second, third, and fourth circuit portions 120, 122, 124, and 126 includes each of four different circuit components, namely, a clock gating cell (CGC) circuit 144 (which can also be referred to simply as a clock gating cell), a duty cycle correction (DCC) circuit 146, and a multiplication by two (×2) circuit 148, and an additional DCC circuit 149. The particular electrical circuit components associated with or forming the ×2 circuits 148, DCC circuits 146, 149, and CGC circuits 144 can in the present embodiment take the forms discussed below with respect to FIGS. 3A, 3B, and 3C, respectively. Although FIG. 1 shows that each of the circuit portions 120, 122, 124, 126 includes the same intermediate circuit portion 130 including the same combination of one of each of the CGC circuits 144, DCC circuits 146, ×2 circuits 148, and additional DCC circuits 149, in other embodiments it is not required that each of the different circuit portions to which the clock signal is being distributed have the exact same structure. For example, in one alternate embodiment, the intermediate circuit portion associated with the first circuit portion 120 is different in its composition relative to the intermediate circuit portions associated with the second, third, and fourth circuit portions 122, 124, and 126. Also, any one or more of the ×2 circuits 148, DCC circuits 146, 149, and CGC circuits 144 can take alternate forms other than those shown in FIGS. 3A, 3B, and 3C depending upon the application and, indeed, these circuits can take a variety of forms depending upon the embodiment. Although in some embodiments each of the DCC circuit 146 and 149 can be identical in structure, in other embodiments one or more of the DCC circuits can differ from one or more others of the DCC circuits in terms of the structure of those circuits.

Further with respect to the present embodiment of FIG. 1, it is an input terminal of the respective CGC circuit 144 of each of the intermediate circuit portions 130 that serves as the input terminal of that respective intermediate circuit portion overall, and that receives the additional clock signal 118 provided by way of the PLL circuit 106 (via the additional buffer circuit portion 134 and respective first buffer circuit portion 128). Additionally, it is an output terminal of the additional DCC circuit 149 of each respective intermediate circuit portion 130 that serves as the output terminal of that respective intermediate circuit portion overall, and at which is provided the modified clock signal 138. Further, the DCC circuit 146 of each respective one of the intermediate circuit portions 130 is coupled in series between the respective CGC circuit 144 of that intermediate circuit portion and the respective ×2 circuit 148 of that intermediate circuit portion. That is, an input terminal of the respective DCC circuit 146 of the respective intermediate circuit portion 130 is coupled to the output terminal of the respective CGC circuit 144 of that intermediate circuit portion, and an output terminal of the respective DCC circuit is coupled to an input terminal of the respective ×2 circuit 148 of that intermediate circuit portion. Additionally, the ×2 circuit 148 of each respective one of the intermediate circuit portions 130 is coupled in series between the respective DCC circuit 146 of that intermediate circuit portion and the respective additional DCC circuit 149 of that intermediate circuit portion. That is, an input terminal of tile respective ×2 circuit 148 of the respective intermediate circuit portion 130 is coupled to the output terminal of the respective DCC circuit 146 of that intermediate circuit portion, and an output terminal of the respective ×2 circuit 148 is coupled to an input terminal of the additional DCC circuit 149 of that intermediate circuit portion.

In addition to the circuit portions of the integrated circuit 100 already discussed above, in the present embodiment the integrated circuit 100 also includes certain additional components illustrated in FIG. 1. In particular, it should be appreciated that the output terminals of each of the second buffer circuit portions 132 of each of the first and second circuit portions 120 and 122 are coupled to an input terminal 150 of a divider circuit 152 that in turn has an output terminal 154 that is directly coupled to the second input port 112 of the PLL circuit 106. Also, a further buffer circuit portion 156 is coupled between both of those output terminals of the second buffer circuit portions 132 of the first and second circuit portions 120 and 122 and a further circuit portion 158. The further circuit portion 158 more particularly is coupled between the output terminal of the further buffer circuit portion 156 and the CGC circuit 144 of the first circuit portion 120. The further circuit portion 158 in the present embodiment is logic that determines the feasibility of clock gating. The delay from the input terminal 136 of the circuit portion 120 to an output terminal 160 of the further circuit portion 158 determines the setup time required to gate the clock (which is shown in FIG. 1 as $\tau_{setup}$). Because the CGC circuit 144 runs at one-half of the frequency of the further circuit portion 158, it achieves a larger time window to resolve the logic in the further circuit portion 158 that determines whether the clock should be gated or not. Further, although FIG. 1 does not illustrate in detail the presence of circuit components connected to the first and second circuit portions 120 and 122 that correspond to the lines 142 representing the circuit components that are the ultimate recipients of the modified clock signals 138, it should nevertheless be understood that such ultimate recipient circuit components nevertheless are typically present and are present in the integrated circuit 100 even though not illustrated in FIG. 1.

The CGC, DCC, ×2, and additional DCC circuits 144, 146, 148, 149 of the integrated circuit 100 particularly operate as follows. To begin, the CGC circuits 144 for each of the circuit portions 120, 122, 124, and 126 are configured to determine whether the clock signals should be propagated through the intermediate circuit portions 130 to the ultimate recipients of the clock signals. That is, there are circumstances in which it is inappropriate or unnecessary for the clock signals to be transmitted and, in such circumstances, in order to save power, the CGC circuits can serve to effectively shut off the transmission of the clock signals to the ultimate recipients (e.g., shut off communication of the modified clock signals 138 to the components represented by the lines 142). With respect to the DCC circuits 146, these circuits are present in order to correct the duty cycle of the output signals from the CGC circuits 144 so that the duty cycle satisfies a duty cycle criterion or requirement, particularly when the meeting of such a criterion or requirement is important or critical for proper system operation. Further, the ×2 circuits 148 serve to multiply the frequency of the clock signals (as provided to the ×2 circuits after being duty cycle corrected by way of the DCC circuits 146) by a factor of two. In alternate embodiments, it should be appreciated that the frequency multiplication factor, which can generally be referred to as a factor M, can be greater than or less than 2 (e.g., 1.5 or 3). As for the additional DCC circuits 149, each of these circuit portions also are present in order to perform duty cycle correction, in this case, with respect to the output signals from the ×2 circuits 148. That is, the ×2 circuits 148 do not necessarily output signals that have a desired (e.g., 50%) duty cycle, and so the additional DCC circuits 149 are provided to ensure that the duty cycle of the signals output by the circuit portions 130 satisfy a duty cycle criterion or requirement, again particularly when the meeting of such a criterion or requirement is important or critical for proper system operation.

It should be appreciated that the integrated circuit 100, particularly due to the presence of the intermediate circuit portions 130, achieves advantageous operation in several respects in terms or the manner in which clock signals are distributed to devices or components (such as the components represented by the lines 142) that are the ultimate recipients or users of the clock signals. First, in at least some embodiments such as in the present embodiment, it can be important for proper operation of the integrated circuit 100 (or one or more components thereof, such as the ×2 circuits 148) that the communicated clock signals have duty cycles that equal or substantially equal 50%. Thanks to the presence of the DCC circuits 146, which are downstream of the CGC circuits 144 but upstream of the ×2 circuits 148 (that is, the DCC circuits receive output signals from the CGC circuits and provide signals to the ×2 circuits), if the CGC circuits 144 output clock signals that have a duty cycle that is substantially different than a 50% duty cycle even though the additional clock signal 118 being provided to the CGC circuits 144 has a 50% duty cycle, the clock signals output by the DCC circuits 146 and provided to the ×2 circuits 148 are duty cycle corrected to have a duty cycle equaling or substantially equaling 50%. Relatedly, the additional DCC circuits 149 also serve to ensure that the signals output from the intermediate circuit portions 130 also have a duty cycle equaling or substantially equaling 50% (or, in alternate embodiments, possibly some other desired level).

Additionally, the above-described integrated circuit 100 arrangement is particularly advantageous insofar as it allows for more effective operation of the CGC circuits 144 and thus allows for enhanced operation in terms of savings of power dissipation. Because of the ×2 circuits 148, if the ultimate recipients of the clock signals such as the components corresponding to the lines 142 require clocking at a particular frequency, the frequency of the additional clock signal 118 (as well as the reference clock signal 102) provided by the PLL circuit 106 can be half the clocking frequency demanded by those ultimate clock signal recipients. For example, the additional clock signal 118 can be 1 GHz as illustrated in FIG. 1 even though the ultimate recipients of the clock signals corresponding to the lines 142 seek to receive a clock signals such as the modified clock signal 138 having a frequency of 2 GHz. This is advantageous for operation of the CGC circuits 144 because the logic of the CGC circuits 144 accordingly can have an effective set up time corresponding to only half the frequency of the ultimate clock signals received by the clock signal recipients, for example, the CGC circuits 144 can have an effective set up time suitable for use with the 1 GHz frequency of the additional clock signal 118 rather than the 2 GHz frequency of the modified clock signals 138.

Further in this regard, as illustrated in FIG. 1, the set up time (again which is shown in FIG. 1 as $\tau_{setup}$) for each of the CGC circuits 144 can be defined as the time propagation of a signal from the CGC circuit 144 of the first circuit portion 120 through the remainder of the intermediate circuit portion 130 of the first circuit portion 120 (that is, propagating through the DCC circuit 146, ×2 circuit 148, and additional DCC circuit 149 of that intermediate circuit portion), further through the second buffer circuit portion 132 of the first circuit portion 120, as well as through the further buffer circuit portion 156 and the further circuit portion 158, and then back to the CGC circuit 144, as represented by a dashed arrow 162. With this definition of the set up time, as further illustrated in FIG. 1 by a timing diagram 164, it can be seen that the set up time is a time that is greater than a full period of a 2 GHz waveform 166 but is less than a full cycle of the 1 GHz wave form 168. Thus, the CGC circuit 144 is able to properly operate upon receiving the additional clock signal 118 that is at the lower frequency (e.g., 1 GHz) even though the CGC circuit would not have been able to properly operate to perform clock gating at the higher frequency clock signal desired by the ultimate clock signal recipients (e.g., 2 GHZ).

In addition to the above features, it should further be appreciated that the modified clock signal 138 output by the first and second circuit portions 120 and 122, which is at the higher (e.g., multiplied by two) frequency, is what is returned to the divider circuit 152. As already discussed, the divider circuit 152 serves to provide the additional input signal 114 to the PLL circuit 106 to allow for phase-locked loop operation. More particularly, due to the operation of the divider circuit 152, the additional input signal 114 has a frequency that is less than the frequency of the modified clock signal 138 by a factor N. In some cases, the factor N is exactly the same factor by which the frequency is increased by the ×2 circuits 148 of the intermediate circuit portions 130 (e.g., a factor of 2). In other embodiments, the factor N by which the frequency is reduced by the divider circuit 152 can be different than the factor of multiplication occurring at the intermediate circuit portions 130. For example, a factor of 20 can be used as N rather than a factor of 2.

Although FIG. 1 shows the integrated circuit 100 as having a particular set of example components including the intermediate circuit portions 130 that allow for higher frequency clock signals to be provided to clock signal recipient circuits relative to the lower frequency clock signal provided by from the PLL circuit 106, the present disclosure is intended to encompass numerous alternate embodiments as well. In particular, in at least some embodiments, alternate embodiments of intermediate circuit portions can be employed in place of the intermediate circuit portions 130 shown in FIG. 1, and four such alternate example embodiments are shown in FIGS. 2A, 2B, 2C, and 2D, respectively. As shown and discussed in further detail below, each of the alternate example embodiment intermediate circuit portions includes a respective combination of two or more of the CGC, DCC, and ×2 circuits 144, 146, and 148 included in the intermediate circuit portions 130 of FIG. 1. In this respect, although FIGS. 2A, 2B, 2C, and 2D are shown as including ones or the DCC circuits 146, as indicated above the additional DCC circuits 149 and DCC circuits 146 shown in FIG. 1 at least in some embodiments are identical in structure (and generally are otherwise interchangeable in terms of their operation) and therefore it should be appreciated that any one or more of the DCC circuits 146 shown in FIGS. 2A, 2B, 2C, and 2D are intended to be equally representative of, and can alternatively be replaced with, corresponding one(s) of the additional DCC circuits 149 of FIG. 1.

Additionally, although not shown implemented in an integrated circuit 100 as illustrated by FIG. 1, it should be understood that each of the alternate embodiment intermediate circuit portions of FIGS. 2A, 2B, 2C, and 2D can be implemented in place of any of the intermediate circuit portions 130 shown in FIG. 1 to arrive at an integrated circuit employing one or more of those alternate embodiment intermediate circuit portions. Again, as was the ease with the intermediate circuit portions 130 of FIG. 1, each of the alternate embodiments of the intermediate circuit portions shown in FIGS. 2A, 2B, 2C, and 2D includes a DCC circuit that is downstream of an ×2 circuit (instead of, or in addition to, a DCC circuit that is upstream of the ×2 circuit as in the case of the intermediate circuit portion 130) and that accordingly performs duty cycle correction upon the clock signal output by that ×2 circuit. In these embodiments, the DCC circuit is provided downstream of the ×2 circuit particularly to ensure that the clock signal ultimately provided to any clock signal recipient satisfies any duty cycle criterion (e.g., has a duty cycle equaling or substantially equaling 50%) that is required by that clock signal recipient or otherwise required. Such operation is particularly significant in circumstances or embodiments in which the ×2 circuit cannot be relied upon to consistently output a higher frequency clock signal that satisfies a particularly required duty cycle criterion. That is, to the extent that the ×2 circuit can be relied upon to provide a higher frequency clock signal satisfying any required duty cycle criterion, than the DCC circuit downstream of the ×2 circuit is not necessary.

Figure 2A:
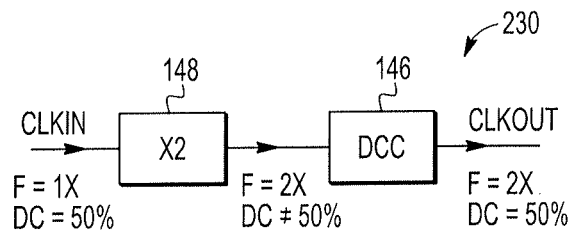
FIGS. 2A-2D are additional schematics showing example alternate embodiments of portions of the circuitry of the example integrated circuit of FIG. 1.

Now referring more particularly to FIG. 2A, a first alternate embodiment intermediate circuit portion shown as an intermediate circuit portion 230 includes one of the ×2 circuits 148 in series with one of the DCC circuits 146. That is, the input clock signal received by the alternate intermediate circuit portion 230 (e.g., the additional clock signal 118) is received first by the ×2 circuit 148, and the output of the ×2 circuit is then provided to the input of the DCC circuit 146, with the output of the DCC circuit being the clock signal to be transmitted to the ultimate clock signal recipient (e.g., the modified clock signal 138). Also as illustrated in FIG. 2A, with such an arrangement, the frequency of the clock signal is doubled (e.g., from 1 GHz to 2 GHz or, more generally, from 1× to 2× with "×" being the frequency of the clock signal received by the intermediate circuit portion 230) due to operation of the ×2 circuit 148, and then remains at that frequency at the output of the DCC circuit 146.

It should be appreciated that the design of the intermediate circuit portion 230 presumes that the duty cycle of the clock signal received at the intermediate circuit portion is at (or substantially at) 50% when it is received by the ×2 circuit 148, but that operation of the ×2 circuit can cause some duty cycle variation such that the duty cycle of the signal provided from the ×2 circuit to the DCC circuit 146 is not at 50%. Thus, it is the purpose of the DCC circuit 146 to correct the clock signal so that the clock signal output by the DCC circuit and the intermediate circuit portion 230 overall again has a duty cycle of 50% (or substantially 50%) as is often typically required by the ultimate clock signal recipients such as the components represented by the lines 142 of FIG. 1. In view of the above, it should be appreciated that the intermediate circuit portion 230 can be employed as a replacement (in terms of the functionality provided) for a PLL circuit that is performing a multiply-by-two frequency multiplication function where the input clock is already providing a signal at 50% duty cycle.

Figure 2B:
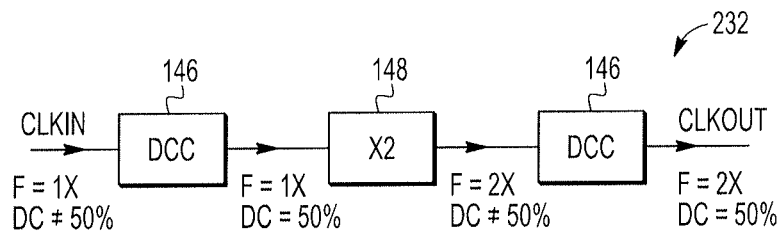

As for FIG. 2B, there is illustrated a second alternate embodiment intermediate circuit portion shown as an intermediate circuit portion 232. The intermediate circuit portion 232 is identical to the intermediate circuit portion 230 of FIG. 2A except insofar as an additional one of the DCC circuits 146 also is provided upstream of the ×2 circuit 148. Thus, in this alternate embodiment, the intermediate circuit portion 232 includes a first of the DCC circuits 146 that receives the input clock signal (e.g., the additional clock signal 118), followed in series by the ×2 circuit 148, which is in turn followed by a second one of the DCC circuits 146 that in turn outputs the output clock signal (e.g., the modified clock signal 138). With this arrangement, it can be appreciated that a desired clock output signal can be provided even in the circumstance where, in contrast to the scenario of FIG. 2A, the input clock signal has a duty cycle that is not equal to 50%. That is, in the embodiment of FIG. 2B, an input clock signal having a particular frequency and a duty cycle that is not 50% is first processed by the first DCC circuit 146 to arrive at a clock signal at that same frequency that has a duty cycle equal to (or substantially equaling) 50%.

Once the clock signal has been corrected in this manner, then the same processing occurs at the ×2 circuit 148 and the second of the DCC circuits 146 as described in relation to FIG. 2A, and thus the output clock signal provided from the second of the DCC circuits 146 and output by the intermediate circuit portion 232 has a frequency that is two times that of the original input clock signal and further has a duty cycle that is equal to (or substantially equals) 50%. It should be appreciated that the intermediate circuit portion 232 can be employed as a replacement (in terms of the functionality provided) for a PLL circuit that is performing a multiply-by-two frequency multiplication function in which the input clock is already providing a clock signal but that clock signal is not at a 50% duty cycle.

It should be observed that the intermediate circuit portions 230 and 232 of FIGS. 2A and 2B, unlike the intermediate circuit portions 130 of FIG. 1, do not include any of the CGC circuits 144. By comparison, turning to FIGS. 2C and 2D, two additional alternate embodiment intermediate circuit portions shown respectively as intermediate circuit portions 234 and 246 do include ones of the CGC circuits 144. More particularly, with respect to the intermediate circuit portion 234 of FIG. 2C, that circuit portion is identical to the intermediate circuit portion 230 of FIG. 2A except insofar as it further includes one of the CGC circuits 144 upstream of the ×2 circuit 148. That is, in the intermediate circuit portion 234 of FIG. 2C, the clock input signal is provided first to an input terminal of the CGC circuit 144, and subsequently the output signal from that CGC circuit is in turn provided to the ×2 circuit 148, which in turn sends a signal for receipt by the input terminal of the DCC circuit 146, which then outputs the clock output signal as the overall output of the intermediate circuit portion (e.g., corresponding to the modified clock signal 138).

Figure 2C:
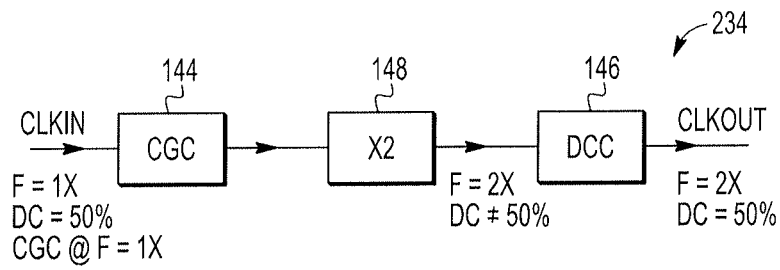

Also as indicated by FIG. 2C, the processing of the clock input signal performed by the CGC circuit 144, ×2 circuit 148, and DCC circuit 146 is identical to that of FIG. 2A except insofar as the CGC circuit 144 is present and can operate on the clock input signal to restrict whether or not that clock input signal is transmitted to the ×2 circuit 148 or not. As with the CGC circuits 144 of the intermediate circuit portions 130 of FIG. 1, the CGC circuit 144 of FIG. 2C advantageously can operate upon a lower-frequency clock signal corresponding to the additional clock signal 118 of FIG. 1 (e.g., F=1×) as opposed to a higher-frequency signal corresponding to the modified clock signal 138, which is at a higher frequency (e.g., F=2×).

Figure 2D:
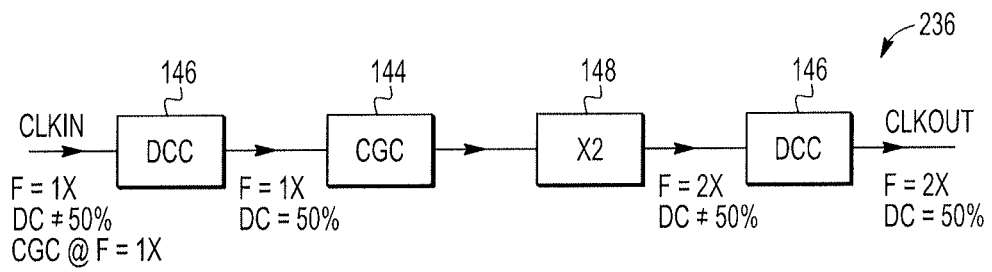

As for FIG. 2D, the intermediate circuit portion 236 shown therein is identical to the intermediate circuit portion 232 of FIG. 2B except insofar as one of the CGC circuits 144 is positioned in series between the first (upstream one) of the DCC circuits 146 and the ×2 circuit 148. Thus, in the intermediate circuit portion 236 of FIG. 2D, the clock input signal is first received by the first of the DCC circuits 146, which outputs for receipt by the CGC circuit 144 a duty cycle corrected clock signal having the same frequency (e.g., 1×) as the clock input signal received by the DCC circuit 146. Upon the CGC circuit receiving the clock input signal from the DCC circuit 146, the CGC circuit 144 then outputs a clock signal of the same frequency for receipt by the ×2 circuit 148 (unless the CGC circuit has determined that the signal should not be communicated), which in turn generates a higher frequency clock signal that is provided for receipt by the second (downstream) one of the DCC circuits 146. That second one of the DCC circuits 146 subsequently outputs a duty cycle corrected clock output signal that is at a higher frequency (e.g., F=2×) relative to the clock signal originally received by the intermediate circuit portion 236, for receipt by the ultimate clock signal recipients.

Therefore, in the embodiment of FIG. 2D, the first (upstream) one of the DCC circuits 146 that receives the clock input signal serves a purpose of ensuring that the duty cycle of the original clock input signal is at a duty cycle equaling (or substantially equaling) 50% prior to that signal being provided to the CGC circuit 144. Otherwise, aside from the operation of the CGC circuit 144 in determining whether or not any clock signals should be ultimately provided to the ×2 circuit 148, the operation of the intermediate circuit portion 236 is identical to that of the intermediate circuit portion 232 of FIG. 2B. It should be appreciated that, by superposition, the intermediate circuit portions of FIGS. 2C and 2D can be derived from the circuit portions shown in FIGS. 2A and 2B.

Although FIGS. 2A-2D provide multiple example alternate embodiments of intermediate circuit portions that can be employed in various embodiments in addition to or instead of the intermediate circuit portions 130 shown in FIG. 1, it should be appreciated that these are only intended to be examples and that other arrangements are also possible and encompassed herein, particularly embodiments that employ one or more multiplier circuits by which the frequency of a clock signal is increased by a factor (e.g., a factor M equaling two or some other factor) alone or in combination with one or more DCC circuits for correcting or otherwise modifying the duty cycle of a given clock signal. It should further be understood from the examples of FIGS. 2A and 2B that, although the embodiment of FIG. 1 shows intermediate circuit portions 130 that include the CGC circuits 144 (as do the embodiments in FIGS. 2C and 2D), CGC circuits may not be present in every embodiment and clock gating may not be performed in every embodiment. That is, in some embodiments encompassed herein, clock signals are provided without restriction to one or more ultimate clock signal recipients such as the circuit components represented by the lines 142 of FIG. 1.

Also it should be appreciated that in at least some embodiments one or more of the intermediate circuit portions 130, 230, 232, 234, 236, and/or other intermediate circuit portions encompassed herein can be used not only at the locations shown in FIG. 1 downstream of the PLL circuit 106 (that is, in between the PLL circuit 106 and the ultimate clock signal recipients), but also or instead can be provided or present at a location upstream of the PLL circuit such as at the location represented by the box 110 of FIG. 1, between the clock 108 and the PLL circuit. For example, in one such embodiment one of the intermediate circuit portions 230 or 232 not employing any of the CGC circuits 144 can be present at the location of the box 110 upstream of the PLL circuit 106 and, by contrast, any of the intermediate circuit portions 130, 234, and/or 236 having the CGC circuits 144 can be provided at any one or more of the locations of the intermediate circuit portions 130 shown in FIG. 1 associated with the circuit portions 120, 122, 124, 126 downstream of the PLL circuit 106 (e.g., at locations between the PLL circuit 106 and the ultimate clock signal recipients such as those represented by the lines 142).

Figure 3A:
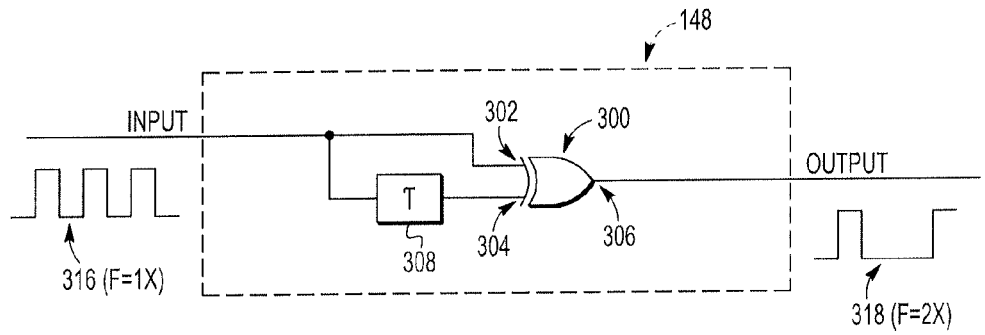
FIGS. 3A-3C are further schematics showing example circuit components that can be implemented to form portions of the circuitry shown in FIGS. 1 and 2A-2D.
Figure 3B:
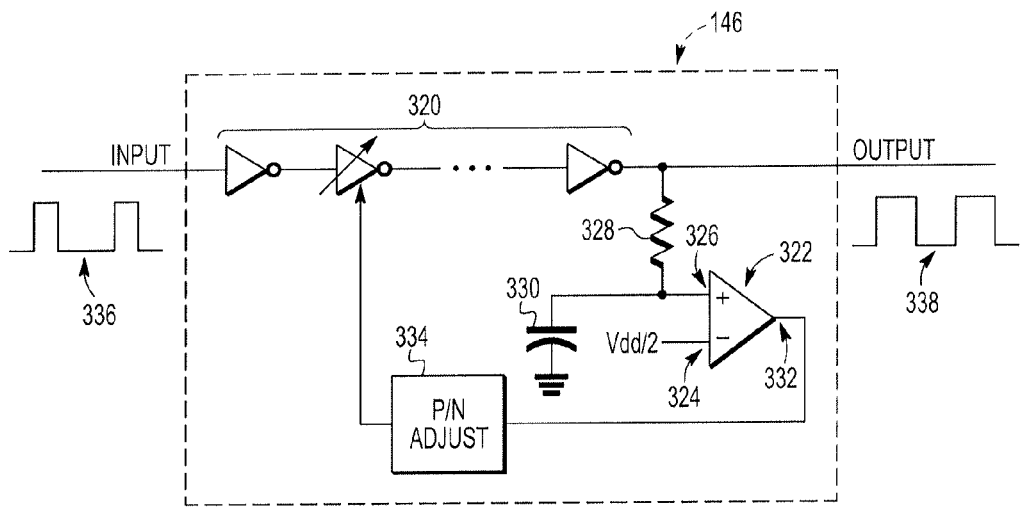
Figure 3C:
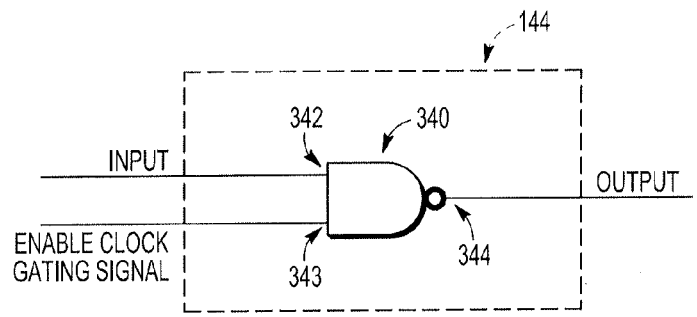

FIGS. 3A, 3B, and 3C, respectively, show in schematic form example circuits that can be employed respectively as one of the ×2 circuits 148, one of the DCC circuits 146, 149, and one of the CGC circuits 144 of any of FIGS. 1, 2A, 2B, 2C, and 2D. Particularly in regard to FIG. 3A, the ×2 circuit 148 is shown to include an exclusive-OR (or "EX-OR") gate 300 having a first input port 302 and a second input port 304 as well as an output port 306. The first input port 302 is coupled to receive the input signal of CGC circuit (e.g., to receive the additional clock signal 118 when implemented as shown in FIG. 1), while the second input port 304 is coupled to the first input port 302 by way of a time delay block 308 that causes there to be a delay between changes in the input signal received at the first input port 302 and the input signal received at the second input port 304. The output port 306 of the EX-OR gate 300 in turn provides an output signal of the ×2 circuit 148. In the present embodiment, the time delay block 308 is set to cause the ×2 circuit 148 to operate in a manner whereby an input clock signal represented by a timing diagram 316 having a lower frequency (e.g., F=1×) is increased to a higher frequency clock output signal represented by a timing diagram 318 (e.g., where F=2×). The ×2 circuit 148 in the present embodiment cannot be relied upon to provide an output signal that having a desired duty cycle, which is why (as already discussed) in the above embodiments each of the ×2 circuits shown is followed by a respective DCC circuit 146 or 149.

Turning to FIG. 3B, in the present embodiment, each of the DCC circuits 146 includes a string of buffers 320 that includes multiple series-connected buffers and that is coupled in series between an input port of the DCC circuit 146 and an output port of the DCC circuit. In addition, the DCC circuit 146 includes an operational amplifier 322 having in inverting terminal 324 to which is applied a voltage that is, in the present embodiment, equal to half the supply voltage ($V_{dd}$ divided by two). Further, a non-inverting terminal 326 of the operational amplified 322 is coupled to the output port of the DCC circuit 146 by way of a resistor 328, and further coupled to ground by way of a capacitor 330. An output port 332 of the operational amplifier 322 is coupled to a P/N adjust circuit 334 that in turn provides a variable P/N that is applied to the string of buffers 320. By virtue of these circuit components, as illustrated, if a clock input signal illustrated by a timing diagram 336 has a duty cycle that is different from 50% as shown, then the DCC circuit 146 operates to correct the duty cycle of that signal and to generate an output clock signal having a duty cycle that is equal to or (or substantially equal to) 50%, as illustrated by a timing diagram 338.

Finally, although the CGC circuits 144 can take any of a variety of forms, as illustrated by FIG. 3C in at least one embodiment each of the CGC circuits 144 can simply include a NAND gate 340 having a first input terminal 342 and a second input terminal 343 as well as an output terminal 344. In this embodiment the first input terminal 342 of the NAND gate 340 particularly serves as the input terminal of the CGC circuit 144 that is coupled to receive an input clock signal (e.g., the input signal received at one of the input terminals 136 of FIG. 1). By comparison, the output terminal 344 of the NAND gate 340 serves as the output terminal of the CGC circuit 144, and the second input terminal 343 serves as another input terminal of the CGC circuit 144 (not shown in FIG. 1) that is coupled to receive a logic enable signal or enable clock gating signal (a signal "ENCG_"), which controls whether the output of the NAND gate 340 switches or whether it stays at a non-switching value. Although FIG. 3C shows the use of the NAND gate 340, in other embodiments other single logic gates can be employed, for example, AND, OR, or NOR gates or simply inverters can be employed.

Although the above discussion (and FIGS. 1-3C) describes example embodiments of systems, circuits, and related methods of operation associated therewith, the present disclosure is intended to encompass numerous other embodiments as well. As already noted, the ×2 circuits 148, DCC circuits 146, 149, and CGC circuits 144 can take a variety of forms depending upon the application and not only the forms shown in regard to FIGS. 3A, 3B, and 3C. Also for example, the circuits shown in FIGS. 3A, 3B, and 3C respectively forming ×2, DCC, and CGC circuits are only examples of circuit (or Silicon) implementations. For example, in other embodiments, one or more of the ×2, DCC, and CGC circuits can be replaced by way of digital logic circuitry. Further for example, the DCC circuits can be achieved by way of a digital, as opposed to an analog, implementation. Also, even though much of the above discussion concentrates on implementations in which the multiplier or multiplication circuitry is configured to perform frequency multiplication in which the frequency is multiplied by a factor (M) of two, in other embodiments the multiplier or multiplication circuitry can be configured to perform frequency multiplication in which the frequency is multiplied by some other factor (e.g., a factor M greater than two or less than two but other than unity). Additionally, the particular frequencies of clock signals discussed above (e.g., 1 GHz being converted to 2 GHz by way of one of the ×2 circuits) are merely examples and, depending upon the embodiment, clock signals at any arbitrary frequency levels can be utilized or generated.

It should also be appreciated that the many systems, circuits, and methods of operation described above in detail or otherwise encompassed by the present disclosure can be implemented in numerous context, in integrated circuits or other circuits or components or systems. For example, in at least some embodiments, the systems, circuits, and methods of operation described above or otherwise encompassed herein can be used in networking systems, automotive applications, and other applications, In view of the above discussion, it should be appreciated that, in at least some example embodiments, the present invention relates to a circuit that includes a multiplier circuit portion, a first duty cycle correction (DCC) circuit portion, and a clock gating circuit portion. The multiplier circuit portion, DCC circuit portion, and clock gating circuit portion are all coupled in series with one another between an input port and an output port of the circuit. Also, the circuit is capable of receiving at the input port a first clock signal having a first frequency and, based at least indirectly upon the first clock signal, outputting a second clock signal having a second frequency that is related by a factor to the first frequency.

Further, in at least some such embodiments, a first input terminal of the clock gating circuit portion is the input port, and a first output terminal of the clock gating circuit portion is directly coupled to either the DCC circuit portion or the multiplier circuit portion. Also, in at least such embodiments, if the first output terminal is coupled to the DCC circuit portion, then the DCC circuit portion is coupled in series between the clock gating circuit portion and the multiplier circuit portion and an additional DCC circuit output terminal of an additional DCC circuit portion coupled to the multiplier circuit is the output port of the circuit. Further, in at least some such embodiments, if the first output terminal is coupled to the multiplier circuit portion, then the multiplier circuit portion is coupled in series between the clock gating circuit portion and the DCC circuit portion and a DCC circuit portion output terminal of the DCC circuit portion is the output port of the circuit.

Additionally, in at least some such embodiments, the circuit also further includes an additional DCC circuit portion, where the clock gating circuit portion is coupled in series between the additional DCC circuit portion and the multiplier circuit portion, and where the multiplier circuit portion is coupled in series between the clock gating circuit portion and the first DCC circuit portion. Further, in at least some such embodiments, the multiplier circuit portion is a multiply-by-two circuit portion that is configured to receive either the first clock signal having the first frequency or a first additional clock signal that also has the first frequency and that is at least indirectly related to the first clock signal, and to output either the second clock signal having the second frequency or a second additional clock signal based at least indirectly the second clock signal, and wherein the factor by which the first and second frequencies are related is two, such that the second frequency is two times the first frequency.

Also, in at least some such embodiments, the multiplier circuit includes a multiplier circuit input terminal, a multiplier circuit output terminal, and an EX-OR gate, where the multiplier circuit input terminal is directly coupled to a first EX-OR gate input terminal of the EX-OR gate and is indirectly coupled to a second EX-OR gate input terminal of the EX-OR gate by way of a time delay circuit portion, and where an EX-OR gate output terminal of the EX-OR gate is, or is coupled directly to, the multiplier circuit output terminal. Further, in at least some such embodiments, due to an operation of the DCC circuit portion, the second clock signal satisfies a first duty cycle criterion, where the first duty cycle criterion is that a duty cycle of the second clock signal either equals or substantially equals 50%. Additionally, in at least some such embodiments, the DCC circuit portion includes a plurality of buffers coupled in series between a DCC circuit portion input terminal and a DCC circuit portion output terminal, further includes an operational amplifier having an inverting terminal and a non-inverting terminal, the non-inverting terminal being coupled to the DCC circuit portion output terminal by way of a resistor and coupled to ground by way of a capacitor, and additionally includes a P/N adjust circuit portion that is configured to receive an output signal from the operational amplifier and provide at least one further signal based at least indirectly upon the output signal to adjust at least one parameter of one or more of the buffers of the plurality of buffers, and the clock gating circuit portion includes at least one logic gate coupled between a clock gating circuit portion input terminal and a clock gating circuit portion output terminal.

Further, in at least some example embodiments, the present invention relates to a system for implementation in an integrated circuit. The system includes as phase-locked loop (PLL) circuit portion that receives a first clock signal, and at least one circuit portion that is configured to receive a second clock signal. Also, the system includes an intermediate circuit portion that is configured to receive at an input port the first clock signal or a first intermediate signal based at least indirectly upon the first clock signal, the first clock signal or first intermediate signal having a first frequency, and to provide at an output port the second clock signal or a second intermediate signal upon which the second clock signal is based at least indirectly, the second clock signal or second intermediate signal having a second frequency related to the first frequency by a factor. The at least one intermediate circuit portion includes at least a first intermediate circuit portion and a second intermediate circuit portion that are respectively coupled in series with one another between the input and output ports, where the first intermediate circuit portion is a multiplication circuit portion and the second intermediate circuit portion is a first duty cycle correction (DCC) circuit portion.

Additionally, in at least some such embodiments, the multiplication circuit portion includes a first input terminal and a first output terminal, the first DCC circuit portion includes a second input terminal and a second output terminal, the first output terminal is coupled directly to the second input terminal, and the second output terminal constitutes the output port of the at least one intermediate circuit portion. Further, in least some such embodiments, the first input terminal constitutes the input port of the at least one intermediate circuit portion. Also, in at least some such embodiments, the at least one intermediate circuit portion additionally includes a clock gating circuit portion that includes a third input terminal and a third output terminal, and the third output terminal is coupled directly to the first input terminal. Also, in at least some such embodiments, the third input terminal constitutes the input port of the at least one intermediate circuit portion. Further, in at least some such embodiments, the at least one intermediate circuit portion additionally includes an additional DCC circuit portion that includes a fourth input terminal and a fourth output terminal, where the fourth output terminal is coupled directly to the third input terminal, and where the fourth input terminal constitutes the input port of the at least one intermediate circuit portion. Also, in at least some such embodiments, the at least one intermediate circuit portion additionally includes an additional DCC circuit portion that includes a third input terminal and a third output terminal, where the third output terminal is coupled directly to the first input terminal, and wherein the third input terminal constitutes the input port of the at least one intermediate circuit portion.

Further, in at least some such embodiments, the circuit also includes a clock gating circuit portion and an additional DCC circuit portion, where the clock gating circuit portion includes a first input terminal and a first output terminal, where the additional DCC circuit portion includes a second input terminal and a second output terminal, where the multiplication circuit portion includes a third input terminal and a third output terminal, where the first DCC circuit portion includes a fourth input terminal and a fourth output terminal, where the first output terminal is coupled directly to the second input terminal, where the second output terminal is coupled directly to the third input terminal, where the third output terminal is coupled directly to the fourth input terminal, and where the first input terminal constitutes the input port of the at least one intermediate circuit portion and the fourth output terminal constitutes the output port of the at least one intermediate circuit portion. Additionally, in at least some such embodiments, the circuit further includes one or both of an additional intermediate circuit portion including an additional DCC circuit portion and an additional multiplication circuit portion, where the additional intermediate circuit portion is coupled to a PLL input port of the PLL circuit portion, and a further intermediate circuit portion that is configured to receive at a further input port the first clock signal to provide at a further output port a further clock signal, the further clock signal having the second frequency, where the further intermediate circuit portion includes a further multiplication circuit portion and a further (DCC) circuit portion.

Additionally, in at least some embodiments, the present invention relates to a method of operating an integrated circuit. The method includes providing a first clock signal from a phase-locked loop (PLL) circuit portion, where the first clock signal is at a first frequency, receiving the first clock signal or a first intermediate clock signal based at least indirectly on the first clock signal at a first intermediate circuit portion, and performing processing including frequency multiplication and duty cycle correction at the first intermediate circuit portion so as to generate a second clock signal based upon the received first clock signal or first intermediate clock signal, wherein the second clock signal is at a second frequency different from the first frequency by a factor and satisfies a duty cycle criterion. The method also includes receiving the second clock signal or a second intermediate clock signal based at least indirectly on the second clock signal at an additional circuit portion that is configured to operate at least partly in accordance with the received second clock signal or second intermediate clock signal. In at least some such embodiments, the performing of the processing at the first intermediate circuit portion additionally includes clock gating by way of a clock gating circuit portion.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A circuit comprising:
a multiplier circuit portion;
a first duty cycle correction (DCC) circuit portion; and
a clock gating circuit portion,
wherein the multiplier circuit portion, the first DCC circuit portion, and the clock gating circuit portion are all coupled in series with one another between an input port and an output port of the circuit,
wherein the circuit is capable of receiving at the input port a first clock signal having a first frequency and, based at least indirectly upon the first clock signal, outputting a second clock signal having a second frequency that is related by a factor to the first frequency,
wherein the first DCC circuit portion includes a plurality of buffers coupled in series between a DCC circuit portion input terminal and a DCC circuit portion output terminal, further includes an operational amplifier having an inverting terminal and a non-inverting terminal, the non-inverting terminal being coupled to the DCC circuit portion output terminal by way of a resistor and coupled to ground by way of a capacitor, and additionally includes a P/N adjust circuit portion that is configured to receive an output signal from the operational amplifier and provide at least one further signal based at least indirectly upon the output signal to adjust at least one parameter of one or more of the buffers of the plurality of buffers, and
wherein the clock gating circuit portion includes at least one logic gate coupled between a clock gating circuit portion input terminal and a clock gating circuit portion output terminal.

2. The circuit of claim 1, wherein the clock gating circuit portion input terminal is the input port, and wherein the clock gating circuit portion output terminal is directly coupled to either the first DCC circuit portion or the multiplier circuit portion.

3. The circuit of claim 2, wherein if the clock gating circuit portion output terminal is coupled to the first DCC circuit portion, then the first DCC circuit portion is coupled in series between the clock gating circuit portion and the multiplier circuit portion and an additional DCC circuit output terminal of an additional DCC circuit portion coupled to the multiplier circuit is the output port of the circuit.

4. The circuit of claim 2, wherein if the clock gating circuit portion output terminal is coupled to the multiplier circuit portion, then the multiplier circuit portion is coupled in series between the clock gating circuit portion and the first DCC circuit portion and a DCC circuit portion output terminal of the first DCC circuit portion is the output port of the circuit.

5. The circuit of claim 1, further comprising an additional DCC circuit portion, wherein the clock gating circuit portion is coupled in series between the additional DCC circuit portion and the multiplier circuit portion, and wherein the multiplier circuit portion is coupled in series between the clock gating circuit portion and the first DCC circuit portion.

6. The circuit of claim 1, wherein the multiplier circuit portion is a multiply-by-two circuit portion that is configured to receive either the first clock signal having the first frequency or a first additional clock signal that also has the first frequency and that is at least indirectly related to the first clock signal, and to output either the second clock signal having the second frequency or a second additional clock signal based at least indirectly the second clock signal, and wherein the factor by which the first and second frequencies are related is two, such that the second frequency is two times the first frequency.

7. The circuit of claim 1, wherein the multiplier circuit portion includes a multiplier circuit input terminal, a multiplier circuit output terminal, and an EX-OR gate, wherein the multiplier circuit input terminal is directly coupled to a first EX-OR gate input terminal of the EX-OR gate and is indirectly coupled to a second EX-OR gate input terminal of the EX-OR gate by way of a time delay circuit portion, and wherein an EX-OR gate output terminal of the EX-OR gate is, or is coupled directly to, the multiplier circuit output terminal.

8. The circuit of claim 1 wherein, due to an operation of the first DCC circuit portion, the second clock signal satisfies a first duty cycle criterion, and wherein the first duty cycle criterion is that a duty cycle of the second clock signal either equals or substantially equals 50%.

9. A system for implementation in an integrated circuit, the system comprising:
a phase-locked loop (PLL) circuit portion that receives a first clock signal;
at least one circuit portion that is configured to receive a second clock signal; aid at least one intermediate circuit portion that is configured to receive at an input port the first clock signal or a first intermediate signal based at least indirectly upon the first clock signal, the first clock signal or first intermediate signal having a first frequency, and to provide at an output port the second clock signal or a second intermediate signal upon which the second clock signal is based at least indirectly, the second clock signal or second intermediate signal having a second frequency related to the first frequency by a factor, wherein the at least one intermediate circuit portion includes at least a first intermediate circuit portion and a second intermediate circuit portion that are respectively coupled in series with one another between the input and output ports, wherein the first intermediate circuit portion is a first multiplication circuit portion and the second intermediate circuit portion is a first duty cycle correction (DCC) circuit portion;

an additional intermediate circuit portion including an additional DCC circuit portion and an additional multiplication circuit portion, wherein the additional intermediate circuit portion is coupled to a PLL input port of the PLL circuit portion; and a further intermediate circuit portion that is configured to receive at a further input port the first clock signal to provide at a further output port a further clock signal, the further clock signal having the second frequency, wherein the further intermediate circuit portion includes a further multiplication circuit portion and a further DCC circuit portion.

10. The system of claim 9, wherein the first multiplication circuit portion includes a first input terminal and a first output terminal, wherein the first DCC circuit portion includes a second input terminal and a second output terminal, wherein the first output terminal is coupled directly to the second input terminal, and wherein the second output terminal constitutes the output port of the at least one intermediate circuit portion.

11. The system of claim 10, wherein the first input terminal constitutes the input port of the at least one intermediate circuit portion.

12. The system of claim 10, wherein the at least one intermediate circuit portion additionally includes a clock gating circuit portion that includes a third input terminal and a third output terminal, wherein the third output terminal is coupled directly to the first input terminal.

13. The system of claim 12, wherein the third input terminal constitutes the input port of the at least one intermediate circuit portion.

14. The system of claim 12, wherein the at least one intermediate circuit portion additionally includes a fourth DCC circuit portion that includes a fourth input terminal and a fourth output terminal, wherein the fourth output terminal is coupled directly to the third input terminal, and wherein the fourth input terminal constitutes the input port of the at least one intermediate circuit portion.

15. The system of claim 10, wherein the at least one intermediate circuit portion additionally includes a fourth DCC circuit portion that includes a third input terminal and a third output terminal, wherein the third output terminal is coupled directly to the first input terminal, and wherein the third input terminal constitutes the input port of the at least one intermediate circuit portion.

16. The system of claim 9, further comprising a clock gating circuit portion and a fourth DCC circuit portion, wherein the clock gating circuit portion includes a first input terminal and a first output terminal, wherein the fourth DCC circuit portion includes a second input terminal and a second output terminal, wherein the first multiplication circuit portion includes a third input terminal and a third output terminal, wherein the first DCC circuit portion includes a fourth input terminal and a fourth output terminal, wherein the first output terminal is coupled directly to the second input terminal, wherein the second output terminal is coupled directly to the third input terminal, wherein the third output terminal is coupled directly to the fourth input terminal, and wherein the first input terminal constitutes the input port of the at least one intermediate circuit portion and the fourth output terminal constitutes the output port of the at least one intermediate circuit portion.

17. A system for implementation in an integrated circuit, the system comprising:

a phase-locked loop (PLL) circuit portion that receives a first clock signal;

at least one circuit portion that is configured to receive a second clock signal;

at least one intermediate circuit portion that is configured to receive at an input port the first clock signal or a first intermediate signal based at least indirectly upon the first clock signal, the first clock signal or first intermediate signal having a first frequency, and to provide at an output port the second clock signal or a second intermediate signal upon which the second clock signal is based at least indirectly, the second clock signal or second intermediate signal having a second frequency related to the first frequency by a factor, wherein the at least one intermediate circuit portion includes at least a first intermediate circuit portion and a second intermediate circuit portion that are respectively coupled in series with one another between the input and output ports, wherein the first intermediate circuit portion is a multiplication circuit portion and the second intermediate circuit portion is a first duty cycle correction (DCC) circuit portion;

a clock gating circuit portion; and an additional DCC circuit portion, wherein the clock gating circuit portion includes a first input terminal and a first output terminal, wherein the additional DCC circuit portion includes a second input terminal and a second output terminal, wherein the multiplication circuit portion includes a third input terminal and a third output terminal, wherein the first DCC circuit portion includes a fourth input terminal and a fourth output terminal, and wherein the first output terminal is coupled directly to the second input terminal, wherein the second output terminal is coupled directly to the third input terminal, wherein the third output terminal is coupled directly to the fourth input terminal, and wherein the first input terminal constitutes the input port of the at least one intermediate circuit portion and the fourth output terminal constitutes the output port of the at least one intermediate circuit portion.

18. The system of claim 17, further comprising:

a further intermediate circuit portion including a further DCC circuit portion and a further multiplication circuit portion, wherein the further intermediate circuit portion is coupled to a PLL input port of the PLL circuit portion.

19. The system of claim 17, further comprising:

a further intermediate circuit portion that is configured to receive at a further input port the first clock signal to provide at a further output port a further clock signal, the further clock signal having the second frequency, wherein the further intermediate circuit portion includes a further multiplication circuit portion and a further DCC circuit portion.

\* \* \* \* \*